(12) United States Patent
Puri et al.

(10) Patent No.: US 6,871,297 B2
(45) Date of Patent: Mar. 22, 2005

(54) POWER-ON STATE MACHINE IMPLEMENTATION WITH A COUNTER TO CONTROL THE SCAN FOR PRODUCTS WITH HARD-BISR MEMORIES

(75) Inventors: Mukesh K. Puri, Fremont, CA (US); Ghasi R. Agrawal, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 526 days.

(21) Appl. No.: 10/120,670

(22) Filed: Apr. 11, 2002

(65) Prior Publication Data

US 2003/0196143 A1 Oct. 16, 2003

(51) Int. Cl.[7] .............................................. G06F 11/00
(52) U.S. Cl. ............................ 714/30; 714/7; 714/733
(58) Field of Search ............................... 714/30, 7, 733, 714/734, 738; 365/201

(56) References Cited

U.S. PATENT DOCUMENTS

| | | | | |
|---|---|---|---|---|
| 5,577,050 A | | 11/1996 | Bair et al. ................ 371/10.2 |
| 5,764,878 A | | 6/1998 | Kablanian et al. ...... 395/182.05 |
| 5,956,350 A | * | 9/1999 | Irrinki et al. ................ 714/718 |
| 6,067,262 A | * | 5/2000 | Irrinki et al. ................ 365/201 |
| 6,249,889 B1 | | 6/2001 | Rajsuman et al. .......... 714/718 |
| 6,324,106 B2 | | 11/2001 | Urakawa ..................... 365/200 |
| 6,505,308 B1 | * | 1/2003 | Schwarz ...................... 714/30 |
| 6,505,313 B1 | * | 1/2003 | Phan et al. ................. 714/718 |
| 6,560,740 B1 | * | 5/2003 | Zuraski et al. ............. 714/733 |
| 6,574,757 B1 | * | 6/2003 | Park et al. .................. 714/710 |
| 6,651,202 B1 | * | 11/2003 | Phan .......................... 714/733 |
| 6,691,264 B2 | * | 2/2004 | Huang ........................ 714/723 |

* cited by examiner

*Primary Examiner*—Scott Baderman
(74) *Attorney, Agent, or Firm*—Christopher P. Maiorana PC

(57) ABSTRACT

An apparatus comprising a controller circuit and a BISR assembly circuit. The controller circuit may be configured to present one or more control signals. The control signals may be configured to control one or more built-in self-test (BIST) and built-in self-repair (BISR) modes of operation. The BISR assembly circuit generally comprises one or more memory blocks each comprising a counter configured to generate a clock cycle count value in response to a repair solution during the BIST and BISR operations. The memory blocks may be remapped in response to the count values during one or more of the BISR operations.

20 Claims, 4 Drawing Sheets

POWER-ON STATE MACHINE IMPLEMENTATION WITH A COUNTER TO CONTROL THE SCAN FOR PRODUCTS WITH HARD-BISR MEMORIES

FIELD OF THE INVENTION

The present invention relates to a method and/or architecture for built in self repair (BISR) memories generally and, more particularly, to a power-on state machine implementation with a counter to control the scan of hard-BISR memories.

BACKGROUND OF THE INVENTION

Memory circuits can contain defective (i.e., faulty) memory cells. Built-in self-test (BIST) and built-in self-repair (BISR) routines are performed to determine the faulty memory cells and substitute redundant functional memory cells for the defective memory cells. During a BIST and BISR (BIST/BISR) routine, a device where the memory circuit is implemented determines a row containing one or more faulty memory cells via a self-diagnostic routine and implements address mapping logic to substitute a functional row for the defective row. Hard BISR routines are configured to burn the functional addresses via fuses in a fuse box (or bank) that is implemented in the device. A hard BISR operation mode is configured to load memory repair information directly from the fuse box into memory registers. The memory is remapped to functional locations without re-running the BIST routine.

The steps of the hard BISR routine are as follows:

1. During a wafer sort testing process during chip manufacture, the BIST/BISR routine is performed on the device to (i) determine the repair solution for the memory and (ii) scan out the repair solution. A test access port (TAP) controller is programmed to assert the relevant commands to a BISR wrapper. However, clocks for the TAP control and the BISR wrapper are different. The hardware (i.e., on silicon) implementation of the repair solution has additional clocking parameters. The BISR clocking is implemented via one or more global registers to synchronize test hardware and test patterns.

2. The memory repair solution is programmed on the die via laser blown fuses.

3. At final test and in the field, the memory repair data from the fuses is scanned into the memory after which the repaired memory is functional.

The steps 1 and 3 are implemented having a specific number of clock cycle counts. Any clock cycle mismatch can result in incorrect memory address values being scanned out during manufacture or scanned in during field operation.

During step 1, the TAP controller scans out the repair solution. The conversion of the scanned out information (i.e., the repair solution) into fuses to be blown is based on the clock cycle count. However, the TAP clock has a different timing from the BISR clock. Furthermore, even when operating in response to the same clock signal, different memory blocks on the chip each implement a different specific number of clock cycles to be applied after which the clocking is configured to stop. Conventional memories are implemented having user (i.e., designer) calculated differences between the TAP clock and the system (i.e., memory) clock. A routine is implemented by the designer and/or user to exercise the repair solutions with the appropriate calculated number of clock cycles.

Conventional approaches fail to provide a standard solution for power-up in hard BISR memories. Conventional approaches define general test requirements and depend on the design engineer and/or customer to determine specific implementation parameters (i.e., clock cycle counts).

Conventional approaches have one or more of the following deficiencies: (i) difficulty in test pattern generation and design debug which can cause extended development cycle time during prototyping, (ii) difficulty in generating test patterns to meet the exact cycle count for scan (i.e., to scan out the repair information when the BIST/BISR routine is performed) during power-up, and/or (iii) long development and test times for prototype circuits.

It would be desirable to have a method and/or architecture for memory circuit BISR that (i) provides a standard BISR implementation for a variety of memories, (ii) eliminates user calculation of test and memory clock cycle differences, (iii) reduces prototype development time and cost, (iv) simplifies user memory implementation, and/or (v) simplifies test pattern generation.

SUMMARY OF THE INVENTION

The present invention concerns an apparatus comprising a controller circuit and a BISR assembly circuit. The controller circuit may be configured to present one or more control signals. The control signals may be configured to control one or more built-in self-test (BIST) and built-in self-repair (BISR) modes of operation. The BISR assembly circuit generally comprises one or more memory blocks each comprising a counter configured to generate a clock cycle count value in response to a repair solution. The memory blocks may be remapped in response to the count values during one or more of the BISR operations.

The objects, features and advantages of the present invention include providing a method and/or architecture for a power-on state machine implementation with a counter to control the scan of hard built-in self-repair (BISR) memories that may (i) provide a standard hard BISR implementation for a variety of memories, (ii) eliminate user calculation of test and memory clock cycle differences, (iii) reduce prototype development time and cost, (iv) simplify user memory implementation, (v) be implemented in soft BISR memories, (vi) be implemented in a variety of memory power-up sequences that have a predetermined cycle count, (vii) simplify test pattern generation, (viii) provide a standard test flow sequence, (ix) provide easier automation of test pattern generation, (x) provide a standard implementation for design and/or test automation, and/or (xi) improve test and memory robustness.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
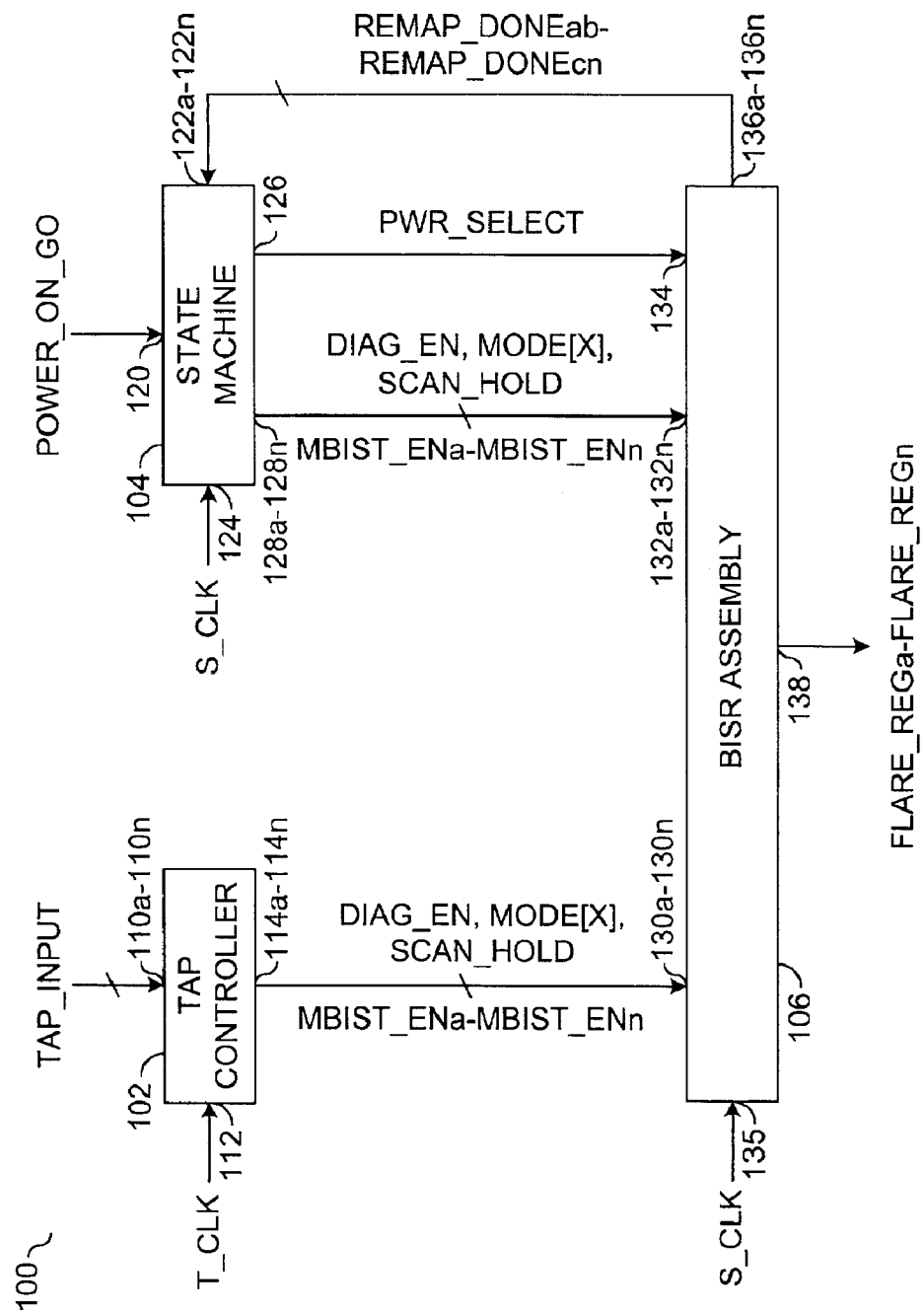
FIG. 1 is a block diagram of a preferred embodiment in accordance with the present invention.

Referring to FIG. 1, a block diagram illustrating a circuit 100 is shown in accordance with a preferred embodiment of the present invention. The circuit 100 may the implemented as a memory circuit that has one or more built-in self-test (BIST) and/or built-in self-repair (BISR) routines (operations, processes, instruction sets, etc.). The BIST routine is generally implemented to determine one or more faulty memory cells and generate a repair solution comprising address locations that correspond to one or more redundant functional memory cells (rows, columns, etc.). The BISR routine is generally configured to implement the memory repair solution (e.g., remap the memory circuit, configure the memory, etc.).

In one example, the BISR routine implemented via the circuit 100 may be a hard (e.g., implemented via burned fuses) BISR operation. In another example, the BISR routine implemented via the circuit 100 may be a soft (e.g., implemented via programmed addresses) BISR operation. However, the circuit 100 may be configured having any appropriate BISR implementation to meet the design criteria of a particular application. In one example, the circuit 100 may be implemented as an embedded memory circuit. The circuit 100 may be configured via register-transfer-level (RTL) code during an insertion of the BIST and/or BISR process into a device where the circuit 100 is implemented (not shown). However, the circuit 100 may be implemented in any appropriate memory and via any appropriate implementation to meet the design criteria of a particular application.

The circuit 100 generally comprises a circuit (or block) 102, a circuit (or block) 104, and a circuit (or block) 106. The circuit (or block) 102 may be implemented as a controller circuit. The circuit 102 is generally implemented as a test access port (TAP) controller. The circuit (or block) 104 may be implemented as a state machine. The circuit 104 is generally implemented as a power-on state machine. The circuit (or block) 106 generally comprises a BISR assembly circuit.

The circuit 102 may have one or more inputs 110a–110n that may receive one or more signals (e.g., TAP_INPUT), an input 112 that may receive a signal (e.g., T_CLK), and one or more outputs 114a–114n that may present one or more signals (e.g., MBIST_ENa–MBIST_ENn, DIAG_EN, MODE[x], and/or SCAN_HOLD). The signals TAP_INPUT may be implemented as control signals. The signals TAP_INPUT are generally chip level signals. The signals TAP_INPUT may be implemented as BIST and/or BISR operation test and repair scan control signals. The signal T_CLK may be implemented as a clock signal. The signal T_CLK may be implemented to provide a timing basis for the controller circuit 102.

The signals MBIST_ENa–MBIST_ENn may be implemented as BIST and/or BISR control signals each configured to control a respective block in the circuit 106. The signal DIAG_EN may be implemented as a control signal. The signal DIAG_EN may be configured to enable one or more diagnostic routines (methods, processes, instruction sets, etc.) (e.g., BIST and/or BISR routines). The signal MODE[x] may be implemented as a multi-bit control signal, where x is an integer. The signal MODE[x] may be configured to control one or more modes of operation (e.g., one or more test operations, normal operation, BIST, BISR, etc.).

The signal SCAN_HOLD may be implemented as a control signal. The circuit 100 may be configured to hold (e.g., register) one or more values generated during the one or more modes of operation (e.g., BIST, BISR, etc.) in response to the signal SCAN_HOLD. One or more of the signals MBIST_ENa–MBIST_ENn, DIAG_EN, MODE[x], and SCAN_HOLD may be asserted (presented) in response to the controller 102 clock signal T_CLK.

The circuit 104 may have an input 120 that may receive a signal (e.g., POWER_ON_GO), one or more inputs 122a–122n that may receive one or more signals (e.g., REMAP_DONEab–REMAP_DONEcn), an input 124 that may receive a signal (e.g., S_CLK), an output 126 that may present a signal (e.g., PWR_SELECT), and one or more outputs 128a–128n that may present the signals MBIST_ENa–MBIST_ENn, DIAG_EN, MODE[x], and/or SCAN_HOLD. The signal POWER_ON_GO may be implemented as a control signal. The signal POWER_ON_GO may be an external signal asserted by a user at power-on that may trigger the state machine circuit 104 to initiate a fuse scan mode (e.g., BISR) of the circuit 100.

The signal REMAP_DONE may be implemented as a control signal. The signal REMAP_DONE may be a BISR (and/or BIST) control signal. The signal REMAP_DONE may be implemented to indicate that the circuit 100 has completed a remapping operation of the circuit 106. The signal S_CLK may be implemented as a clock signal. The signal S_CLK may be the system clock signal (e.g., configured to provide a timing basis) for the device where the circuit 100 is implemented.

The signal PWR_SELECT may be implemented as a control signal. The signal PWR_SELECT may be configured to select (control) one or more modes of operation of the circuit 100. The signal PWR_SELECT may control whether the signals MBIST_ENa–MBIST_ENn, DIAG_EN, MODE[x], and SCAN_HOLD are presented to the circuit 106 by the controller circuit 102 or by the power-on state machine circuit 104. In one example, the signal PWR_SELECT may be asserted in response to the signals REMAP_DONE. The signal PWR_SELECT may be asserted and/or de-asserted in response to the initiation and/or completion of a fuse scan mode (e.g., BISR operation) of the circuit 100. In another example, the signal PWR_SELECT may be asserted and/or de-asserted in response to one or more of the signals TAP_INPUT and/or POWER_ON_GO.

The circuit 106 may have one or more inputs 130a–130n that may receive the signals MBIST_ENa–MBIST_ENn, DIAG_EN, MODE[x], and/or SCAN_HOLD from the circuit 102 during one or more modes of operation, one or more inputs 132a–132n that may receive the signals MBIST_ENa–MBIST_ENn, DIAG_EN, MODE[x], and/or SCAN_HOLD from the circuit 104 during one or more other modes of operation, an input 134 that may receive the signal PWR_SELECT, an input 135 that may receive the signal S_CLK, one or more outputs 136a–136n that may present the signal REMAP_DONE, and an output 138 that may present one or more signals (e.g., FLARE_REGa–FLARE_REGn). The signal FLARE_REG may be implemented as a Faulty Location Analysis and Repair Execution (FLARE™, LSI Logic Corporation, Milpitas, Calif.) block (or unit) register output signal. The signal FLARE_REG generally provides data related to a BISR memory repair solution (e.g., a FLARE scan test block). The signal FLARE_REG is generally presented to an output buffer (not shown).

Figure 2:
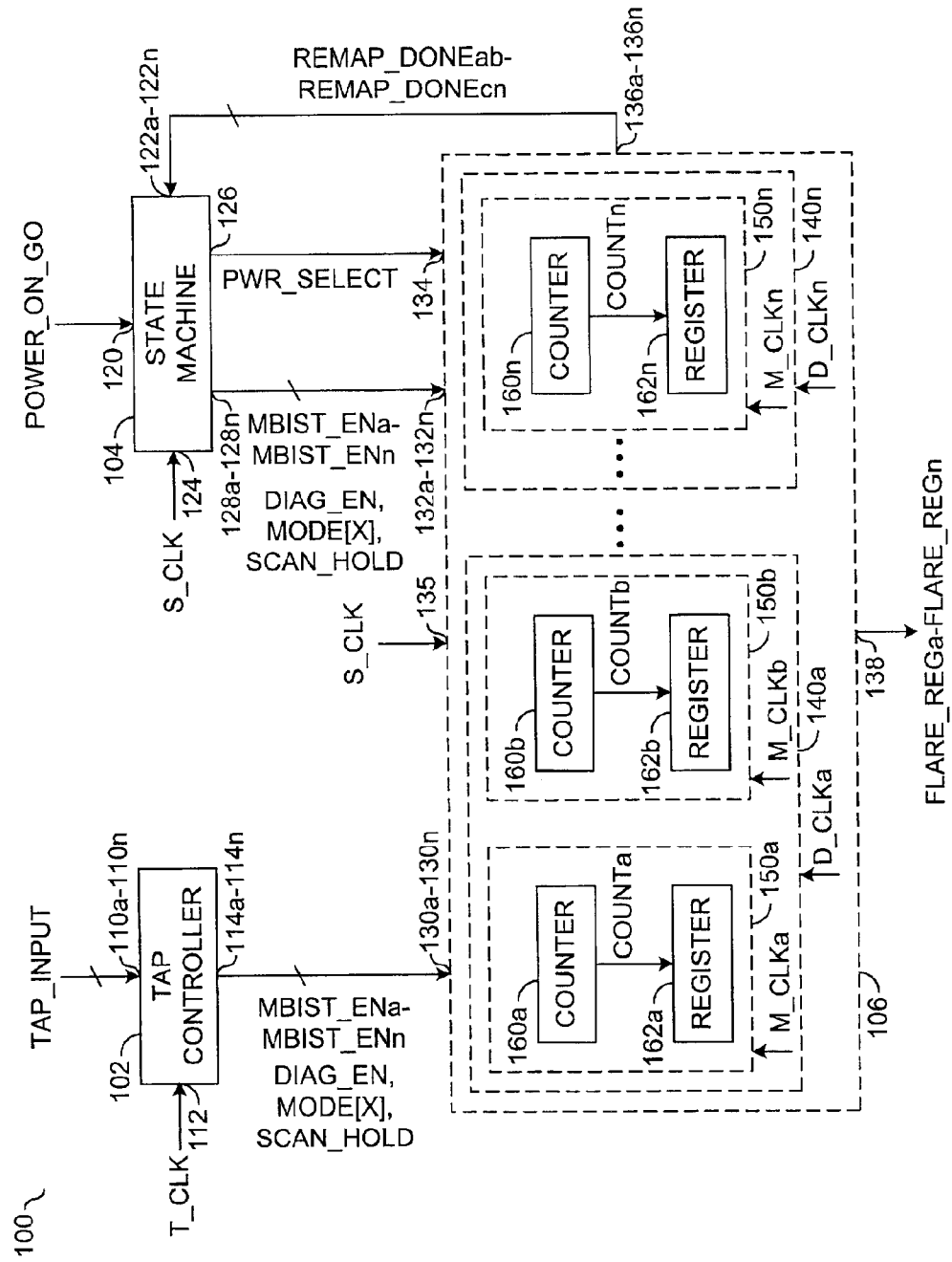
FIG. 2 is a detailed diagram of the circuit of FIG. 1.

Referring to FIG. 2, a detailed block diagram illustrating the circuit 100 is shown. The circuit 106 generally comprises one or more circuits 140a–140n, BIST/BISR logic (not shown), and a BISR wrapper (not shown). The circuit 140 generally comprises one or more memory arrays. The circuit 140 may be implemented as a memory clock domain. Each of the circuits 140a–140n may have an input that may receive a signal (e.g., D_CLKa–D_CLKn). The signal D_CLK may be implemented as a clock signal. The signal D_CLK may be related to (e.g., derived from) the signal S_CLK. The clock domain 140 generally operates at a different timing from the TAP controller circuit 102.

While the clock domains 140a–140n may be configured to operate in response to a common clocking signal (e.g., the system memory clock signal S_CLK), each memory domain 140a–140n generally has different timing (e.g., the domain clock signals D_CLKa–D_CLKn) than the other clock domains as well as the controller 102. In one example, the circuit 100 may comprise two clock domains (e.g., domains 140a and 140n) having respective domain clock signals D_CLKa and D_CLKn. However, the circuit 100 may be implemented having any appropriate number of clock domains 140 and/or domain clock signals D_CLK to meet the design criteria of a particular application.

The circuit 140 generally comprises one or more circuits 150a–150n. In one example, each circuit 140 may comprise two circuits 150 (e.g., the circuit 140a may comprise the circuits 150a and 150b, etc.). However, the circuit 140 may be implemented having any appropriate number of circuits 150 to meet the design criteria of a particular application. The circuit 150 may be implemented as a memory block. The circuit 150 generally comprises an array of memory cells configured in columns and rows. Each of the circuits 150a–150n may have an input that may receive a signal (e.g., M_CLKa–M_CLKn). The signal M_CLK may be implemented as a clock signal. The signals M_CLKa–M_CLKn may be related to (e.g., derived from) one or more of the clock signals D_CLKa–D_CLKn and/or S_CLK. However, each of the memory blocks 150a–150n generally has different timing (e.g., is configured to operate in response to) a different memory clock signal M_CLKa–M_CLKn.

Each of the circuits 150a–150n generally comprises a respective circuit 160 (e.g., circuits 160a–160n) and a respective circuit 162 (e.g., circuits 162a–162n). The circuit 160 may be implemented as a counter. The circuit 162 may be implemented as one or more registers. In one example, the circuit 162 may be implemented as one or more FLARE registers. The circuit 160 is generally configured having a size (e.g., width) that corresponds to the size of the respective circuit 162 (e.g., the counter circuits 160 are generally implemented having a bit-width equal to or greater than the bit-width of the register circuits 162).

The circuits 160a–160n may each present a respective signal (e.g., COUNTa–COUNTn) to the circuits 162a–162n. The signal COUNT may be implemented as a count value. The signal COUNT may be implemented as a clock cycle count (e.g., a count value that corresponds to cycles of the signal M_CLK). The value of the signal COUNT may be generated (determined) in response to the repair solution that corresponds to the memory block 150 (e.g., the respective FLARE scan test block generated during one or more BIST/BISR routines). The signal COUNT generally represents a number of bits corresponding to the memory block 150 repair solution generated in response to the signal M_CLK.

In one example, the circuit 100 may be configured to determine the value of the signals COUNTa–COUNTn during one or more BIST/BISR routines that are performed in response to one or more of the signals TAP_INPUT, T_CLK, and/or S_CLK (via the circuit 102) during the manufacture of the device where the circuit 100 is implemented. The counters 160a–160n may be configured to register (store) the respective values of the signals COUNTa–COUNTn when a BIST/BISR routine has been completed for each of the memory blocks 150a–150n. The signals FLARE_REGa–FLARE_REGn are generally presented by the circuit 106 (via the output 138) in response to one or more of the signals TAP_INPUT, T_CLK, and/or S_CLK. The signals FLARE_REGa–FLARE_REGn are generally presented after the BIST/BISR test routine performed during the manufacture of the device where the circuit 100 is implemented. The circuit 100 may be configured to remap the memory blocks 150 independently of the frequency of the clock signals T_CLK, S_CLK, etc.

Figure 3:
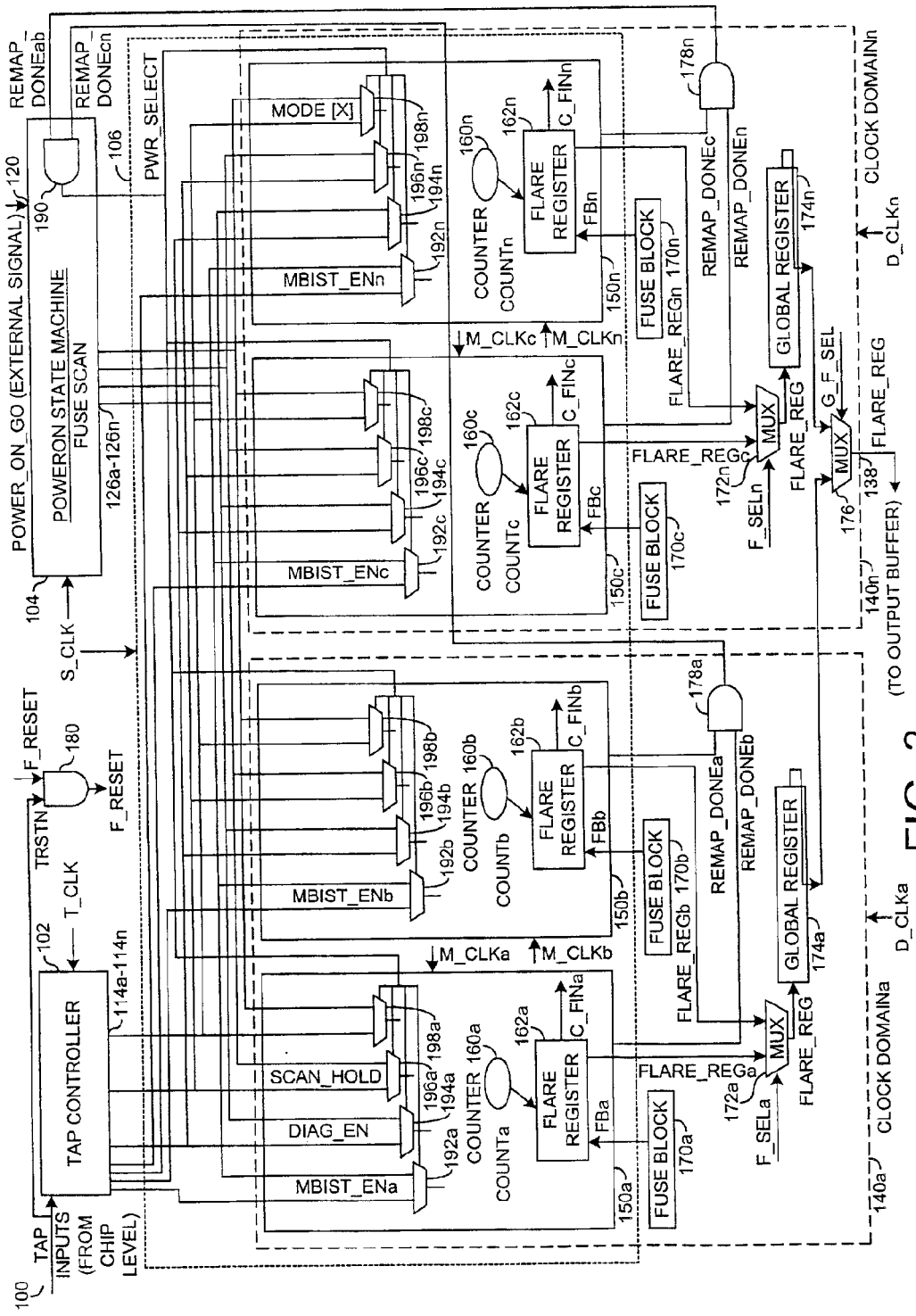
FIG. 3 is another detailed diagram of the circuit of FIG. 1.

Referring to FIG. 3, another detailed block diagram illustrating the circuit 100 is shown. The circuit 100 generally comprises one or more circuits (or blocks) 170a–170n, one or more devices 172a–172n, one or more circuits (or blocks) 174a–174n, a device 176, one or more devices 178a–178n, and a device 180. In one example, the clock domain 140 may comprise the circuits 170, 172, 174 and 178. However, the clock domain 140 may comprise any appropriate circuit configuration to meet the design criteria of a particular application.

During a BISR operation of the circuit 100, the counter 160 generally counts down from the value of the signal COUNT. When the circuits 162a–162n sense (determine) that the count down of the values COUNTa-COUNTn are complete, the circuits 162a–162n may generate a signal (e.g., C_FINa–C_FINn). The signal C_FIN may be a BISR control signal. The circuit 162 may present the signal C_FIN to logic (not shown) in the circuit 150. The circuit 150 may be configured to present the signal REMAP_DONE in response to the signal C_FIN.

The circuit (or block) 170 may be implemented as a fuse block (box, unit, bank, etc.). In one example, the fuses (not shown) in the circuit 170 may be implemented as laser blown fuses. However, the circuit 170 may be implemented via any appropriate fuse (anti-fuse or any other hard circuit configuration device) to meet the design criteria of a particular application. The circuit 104 is generally configured to scan (e.g., perform one or more BISR operations) in response to a number of controller 102 clock cycles (e.g., cycles of the signal T_CLK) that corresponds to a maximum of the size of the fuse block circuits 170a–170n. Fuses in the fuse block 170 are generally burned (blown) in response to the signal FLARE_REG.

The device 172 may be implemented as a multiplexer. The circuit (or block) 174 may be implemented as a register circuit. Each clock domain 140 is generally implemented having a respective circuit 174. The register 174 is generally implemented as a global register having a width that is equal to or greater than the widest (e.g., maximum width) FLARE register 162 in the respective domain 140. The device 176 may be implemented as a multiplexer. The devices 178 and 180 may be implemented as logic gates. In one example, the devices 178 and 180 may be implemented as AND gates. However, the devices 178 and 180 may be implemented as any appropriate device (or logic gate) to meet the design criteria of a particular application.

Each of the fuse blocks 170a–170n may have an output that presents a signal (e.g., FBa–FBn, respectively) to the circuits 162a–162n. The signal FB may be implemented as a digital signal. The signal FB may be implemented as one or more fuse bits that are configured to provide the addresses of faulty and/or functional memory components (e.g., cells, rows, columns, etc.) that are determined and/or presented during the BIST and/or BISR routines. The signal FB may be presented in response to one or more of the signals TAP_INPUT, POWER_ON_GO, MBIST_EN, C_FIN, M_CLK, etc.

In one example, each of the multiplexers 172 may have a first signal input that may receive the signal FLARE_REG from the first FLARE register 162 and a second signal input that may receive the signal FLARE_REG from the second FLARE register 162 in the respective domain 140 (e.g., the circuit 172a may receive the signal FLARE_REGa from the circuit 162a and the signal FLARE_REGb from the circuit 162b, etc.). The multiplexers 172a–172n may have a control input that may receive a respective control signal (e.g., F_SELa–F_SELn) and an output that may present a respective one of the signals FLARE_REGa–FLARE_REGn. Each of the signals F_SEL may correspond to a respective memory block 150 (e.g., the signal F_SELa may be derived from (e.g., presented in response to) the signals MBIST_ENa and MBIST_ENb, the signal F_SELn may be derived from the signals MBIST_ENc and MBIST_ENn, etc.). The circuit 172 may be configured to present the respective one of the signals FLARE_REG in response to the signal F_SEL.

The circuit 174 may have an input that may receive the signal FLARE_REG from the circuit 172 and an output that may present the signal FLARE_REG to the device 176. The circuit 174 may be configured to register (hold) the signal FLARE_REG. In one example, the multiplexer circuit 176 may have a first signal input that may receive the signal FLARE_REG from the first register circuit 174 (e.g., the circuit 174a) and a second signal input that may receive the signal FLARE_REG from the second register circuit 174 (e.g., the circuit 174n). The circuit 176 may have a control input that may receive a signal (e.g., G_F_SEL) and an output that may present a selected one of the signals FLARE_REGa–FLARE_REGn via the output 138 of the circuit 100. The signal G_F_SEL may correspond to a respective memory block 150 (e.g., the signal G_F_SEL may be derived from (e.g., presented in response to) the signals MBIST_ENa–MBIST_ENn). The multiplexer circuit 176 may be configured to present the signal FLARE_REGa–FLARE_REGn that corresponds to the respective memory block 150a–150n in response to the signal G_F_SEL. The multiplexer 176 is generally configured having signal inputs that correspond to each of the global registers 174.

The device 178 may have a first input that may receive the signal REMAP_DONE from a first memory block 150, a second input that may receive the signal REMAP_DONE from a second memory block 150 in the same domain 140 as the first memory block 150, and an output that may present the signal REMAP_DONE. Each memory block 150 generally comprises logic (not shown) configured to disable (stop) a respective scan operation and present the signal REMAP_DONE in response to the signal C_FIN (which is generated in response to the count down of the value of the signal COUNT). For example, the device 178a may receive the signal REMAP_DONEa from the circuit 150a and the signal REMAP_DONEb from the circuit 150b, and present the signal REMAP_DONEab. The circuit 100 may be configured to present the respective signal REMAP_DONEab–REMAP_DONEcn when the BIST and/or BISR process has completed remapping (e.g., configuring to functional memory) the respective memory block 150a–150n. The signal REMAP_DONEab may be implemented as the logical AND of the signals REMAP_DONEa and REMAP_DONEb. The circuit 100 is generally configured to complete the BIST/BISR routine in response to the signals MBIST_EN, T_CLK, S_CLK, etc.

The device 180 may have an input that may receive a signal (e.g., TRSTN), an input that may receive a signal (e.g., F_RESET), and an output that may present the signal F_RESET. The signal TRSTN may be implemented as one or more of the signals TAP_INPUT. The signal TRSTN may be implemented as a reset signal. The signal F_RESET may be implemented as a chip level reset signal. The circuit 100 may be reset in response to the signals TRSTN and F_RESET.

The circuit 104 may comprise a device 190. The device 190 may be implemented as a logic gate. In one example, the device 190 may be implemented as an AND gate. However, the device 190 may be implemented as any appropriate device (or logic gate) to meet the design criteria of a particular application. In one example, device 190 may have a first input that may receive the signal REMAP_DONEab, a second input that may receive the signal REMAP_DONEcn and an output that may present the signal PWR_SELECT via the output 124 of the circuit 104. However, the device 190 may be implemented having any appropriate number of inputs to meet the design criteria of a particular application.

The circuits 150a–150n may comprise devices 192a–192n, devices 194a–194n, devices 196a–196n, and devices 198a–198n, respectively. The devices 192, 194, 196, and 198 may be implemented as a multiplexers. The device 192 may have a first input that may receive the respective signal MBIST_EN from the circuit 102, a second input that may receive the respective signal MBIST_EN from the circuit 104, and a control input that may receive the signal PWR_SELECT. The circuit 192 may have an output that may present the appropriate signal MBIST_EN (e.g., the signal MBIST_EN that corresponds to the circuit 102 in one or more modes of operation and the signal MBIST_EN that corresponds to the circuit 104 in one or more other modes of operation) to control logic (not shown) in the circuit 150 in response signal PWR_SELECT.

The device 194 may have a first input that may receive the respective signal DIAG_EN from the circuit 102, a second input that may receive the respective signal DIAG_EN from the circuit 104, and a control input that may receive the signal PWR_SELECT. The circuit 194 may have an output that may present the appropriate signal DIAG_EN (e.g., the signal DIAG_EN that corresponds to the circuit 102 in one or more modes of operation and the signal DIAG_EN that corresponds to the circuit 104 in one or more other modes of operation) to the control logic in the circuit 150 in response signal PWR_SELECT.

The device 196 may have a first input that may receive the respective signal SCAN_HOLD from the circuit 102, a second input that may receive the respective signal SCAN_HOLD from the circuit 104, and a control input that may receive the signal PWR_SELECT. The circuit 196 may have an output that may present the appropriate signal SCAN_HOLD (e.g., the signal SCAN_HOLD that corresponds to the circuit 102 in one or more modes of operation and the signal SCAN_HOLD that corresponds to the circuit 104 in one or more other modes of operation) to the control logic in the circuit 150 in response signal PWR_SELECT.

The device 198 may have a first input that may receive the respective signal MODE[x] from the circuit 102, a second input that may receive the respective signal MODE[x] from the circuit 104, and a control input that may receive the signal PWR_SELECT. The circuit 198 may have an output that may present the appropriate signal MODE[x] (e.g., the signal MODE[x] that corresponds to the circuit 102 in one or more modes of operation and the signal MODE[x] that corresponds to the circuit 104 in one or more other modes of operation) to the control logic in the circuit 150 in response to signal PWR_SELECT.

Figure 4:
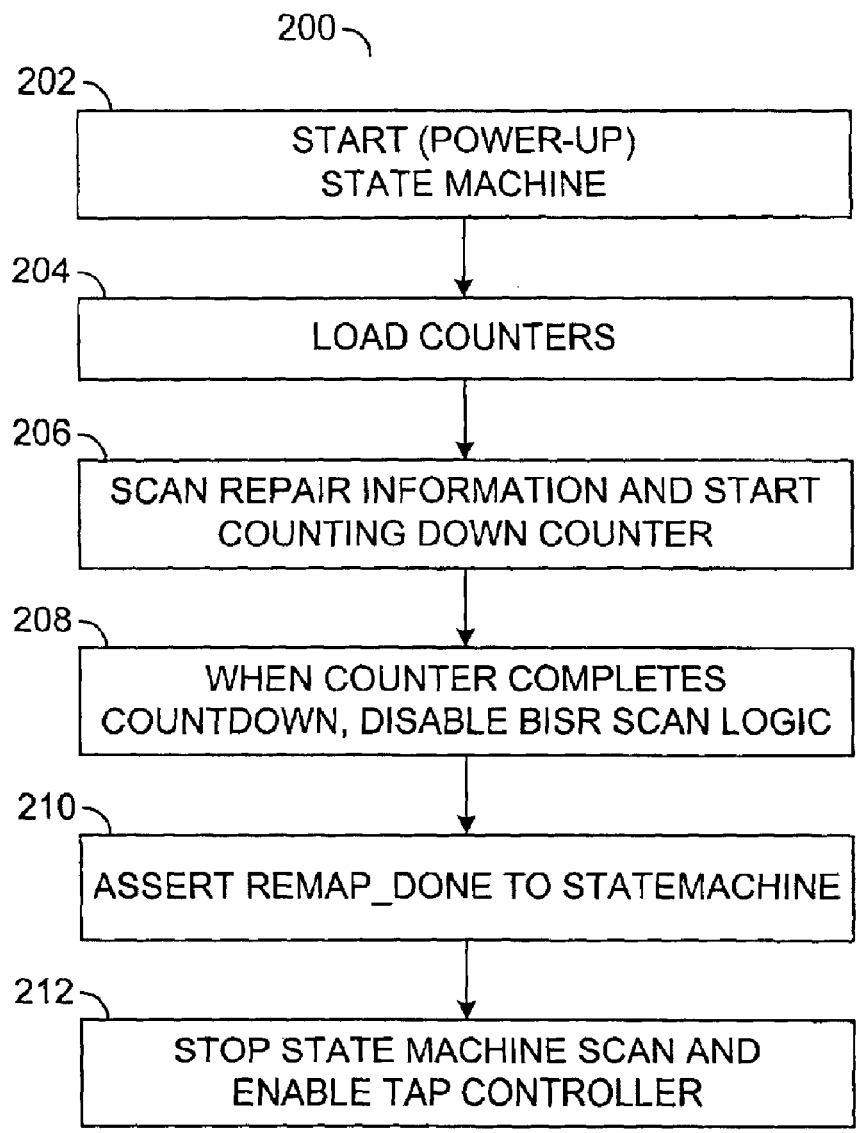
FIG. 4 is a flow diagram of an operation of the present invention.

Referring to FIG. 4, a flow diagram 200 illustrating an operation (method, process, routine, instruction set, etc.) in accordance with a preferred embodiment of the present invention is shown. The operation 200 may be implemented as a BIST/BISR routine that is implemented in connection with (e.g., corresponds to) the circuit 100. The process 200 generally comprises a state (or block) 202, a state (or block) 204, a state (or block) 206, a state (or block) 208, a state (or block) 210, and a state (or block) 212.

During a wafer sort test routine performed during manufacture of the device where the circuit 100 is implemented, a BIST/BISR routine may be performed to determine a repair solution (e.g., the FLARE scan test block) for the circuit 106. The controller 102 may be configured to perform the BIST/BISR routine via a BISR wrapper (not shown). The repair solution for the circuit 106 (e.g., the FLARE scan test block) may be programmed on the die via laser blown fuses in the fuse blocks 170a–170n.

The controller 102 may be configured to perform the BIST/BISR operation of scanning out the circuit 106 FLARE scan test block (e.g., the repair solution). The conversion of the scanned out FLARE scan test block into fuses to be blown in the circuits 170a–170n may be based on one or more cycle counts (e.g., the signals COUNTa–COUNTn). The TAP controller 102 is generally configured to provide the maximum number of clock cycles of the signal T_CLK that may be implemented to generate the BIST/BISR scan. The counters 160a–160n may be configured to determine the respective cycle count of the signal M_CLK (e.g., the respective signal COUNT that corresponds to the memory block 150 repair solution). The circuit 100 is generally configured to implement one or more BISR routines that scan the maximum size of the fuse blocks 170a–170n via the state machine 104.

During the state 202 the state machine 104 may be started (e.g., powered up) in response to the signal POWER_ON_GO asserted as a logic HIGH (e.g., on or 1). The state machine 104 may be configured to control the circuit 100 in response to the signal POWER_ON_GO. The signal POWER_ON_GO is generally asserted (i) during a verification operation during manufacture and (ii) by a customer at power-up of the device where the circuit 100 is implemented. The process 200 generally continues to the state 204.

During the state 204, the counters 160 are generally loaded with the respective values that correspond to the signals COUNT. The routine 200 may continue to the state 206. During the state 206, the routine 200 may be configured to scan the repair information (e.g., the FLARE scan block) into the memory blocks 150 via the signal FB in response to the signals MBIST_EN, S_CLK, M_CLK, COUNT, etc. The counters 160a–160n may be configured to count down from the respective values COUNTa–COUNTn (e.g., exercise the FLARE scan block during the BISR in response to the clock cycle values COUNT) during the scan and repair process of the state 206. The routine 200 generally continues to the state 208.

During the state 208, when the counter 160 completes countdown (e.g., counts down a value that corresponds to the signal COUNT), the scan operation of the respective memory block 150 is disabled (stopped). The circuit 162 generally presents the signal C_FIN to logic in the circuit 150. The circuit 150 generally presents the respective signal REMAP_DONE (e.g., the respective circuit 150 has been remapped (reconfigured) to a functional configuration). The respective BISR logic for the circuit 150 is generally disabled (e.g., the respective signals MBIST_EN, DIAG_EN, SCAN_HOLD, etc. may be de-asserted). The process 200 is generally implemented to provide the appropriate number of clock signals T_CLK, S_CLK, etc. to provide the complete BIST/BISR routines. The counters 160a–160n (in connection with the signals COUNTa–COUNTn and/or M_CLKa–M_CLKn) generally prevent mismatch and/or an incorrect clock cycle count during the BIST/BISR routines.

When all of the circuits 150 have been remapped (e.g., the configuration of the circuit 106 is completed), the process 200 generally asserts (presents) the signal REMAP_DONE to the state machine 104 (e.g., the state 210). The process 200 generally continues to the state 212. During the state 212, the state machine 104 may stop the BISR scan and repair process and the controller 102 may be configured (enabled) to control the circuit 100 during one or more normal modes of operation (e.g. a default mode of the circuit 100).

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
 a controller circuit configured to present one or more control signals, wherein said control signals are configured to control one or more built-in self-test (BIST) and built-in self-repair (BISR) modes of operation; and
 a BISR assembly circuit comprising one or more memory blocks each comprising a counter configured to generate a clock cycle count value in response to a repair solution, wherein said memory blocks are remapped in response to said count values during one or more of said BISR operations.

2. The apparatus according to claim 1, wherein said count valves are generated in response to one or more memory clock signals that correspond to respective ones of said memory blocks.

3. The apparatus according to claim 1, wherein said apparatus further comprises a state machine configured to present said one or more control signals in response to a power-on signal during one or more of said BISR operations.

4. The apparatus according to claim 3, wherein said state machine is configured to de-assert said one or more control signals in response to the completion of said one or more BISR operations.

5. The apparatus according to claim 2, wherein said memory blocks comprise one or more first registers configured to hold address signals that correspond to one or more faulty memory cells and one or more functional memory cells determined during said BIST and BISR operations.

6. The apparatus according to claim 5, wherein said first registers comprise faulty location analysis and repair execution (FLARE) registers.

7. The apparatus according to claim 5, wherein said apparatus comprises one or more fuse blocks coupled to said first registers and configured to be burned in response to said address signals.

8. The apparatus according to claim 1, wherein said counters are configured to count down said count values and said memory blocks are configured to present one or more BISR control signals in response to completion of said count down.

9. The apparatus according to claim 1, wherein said controller circuit comprises a test access port (TAP) controller.

10. The apparatus according to claim 1, wherein said controller circuit is configured to control one or more normal modes of operation.

11. The apparatus according to claim 5, wherein said BISR assembly circuit comprises a multiplexer coupled to one or more global registers configured to present said address signals in response to said one or more control signals.

12. The apparatus according to claim 1, wherein said BISR assembly circuit comprises an embedded memory.

13. An apparatus for remapping a memory circuit comprising:
   means for presenting one or more control signals, wherein said control signals are configured to control one or more built-in self-test (BIST) and built-in self-repair (BISR) modes of operation of said memory circuit;
   means for generating one or more clock cycle count values in response to a repair solution; and
   means for controlling said one or more BISR operations in response to said count values.

14. A method for remapping a memory circuit comprising the steps of:

(A) presenting one or more control signals, wherein said control signals are configured to control one or more built-in self-test (BIST) and built-in self-repair (BISR) modes of operation of said memory circuit;

(B) generating one or more clock cycle count values in response to a repair solution; and (C) controlling said one or more BISR operations in response to said count values.

15. The method according to claim 14, wherein step (A) further comprises the sub-step of:
   presenting said one or more control signals in response to a power-on signal during one or more of said BISR operations.

16. The method according to claim 14, wherein step (A) further comprises the sub-step of:
   de-asserting said one or more control signals in response to the completion of said one or more BISR operations.

17. The method according to claim 14, wherein step (A) further comprises the sub-steps of:
   determining one or more faulty memory cells and one or more functional memory cells during said BIST and BISR operations; and
   holding address signals that correspond to said faulty and functional memory cells in one or more first registers.

18. The method according to claim 17, wherein step (A) further comprises the sub-step of:
   burning one or more fuses coupled to said first registers in response to said address signals.

19. The method according to claim 14, wherein said memory circuit comprises one or more blocks and each of said blocks is configured to operate in response to one or more memory clock signals.

20. The method according to claim 14, wherein step (C) further comprises the sub-steps of:
   counting down said count values; and
   presenting one or more of said control signals in response to completion of said counting down.

* * * * *